(12) United States Patent
Jung

(10) Patent No.: US 6,566,717 B2
(45) Date of Patent: May 20, 2003

(54) INTEGRATED CIRCUIT WITH SILICIDED ESD PROTECTION TRANSISTORS

(75) Inventor: Jong-Chuck Jung, Kyoungki-do (KR)

(73) Assignee: Hynix Semiconductor Inc., Hyoungki-do (KR)

(*) Notice: Subject to any disclaimer, the term of this patent is extended or adjusted under 35 U.S.C. 154(b) by 0 days.

(21) Appl. No.: 09/949,040

(22) Filed: Sep. 7, 2001

(65) Prior Publication Data

US 2002/0140037 A1 Oct. 3, 2002

(30) Foreign Application Priority Data

Mar. 30, 2001 (KR) .......................... 2001-16757

(51) Int. Cl.$^7$ .............................. H01L 23/62
(52) U.S. Cl. ................ 257/357; 257/355; 257/364; 257/173; 257/174
(58) Field of Search ................ 257/355, 357, 257/364, 173, 174

(56) References Cited

U.S. PATENT DOCUMENTS

| | | | |
|---|---|---|---|
| 5,516,717 A | 5/1996 | Hsu | ............ 437/56 |
| 5,585,299 A | 12/1996 | Hsu | ............ 437/56 |
| 5,618,740 A * | 4/1997 | Huang | |
| 5,654,574 A * | 8/1997 | Williams et al. | |
| 5,818,085 A * | 10/1998 | Hsu et al. | |
| 5,841,619 A | 11/1998 | Shigehara et al. | ............ 361/111 |
| 5,877,048 A | 3/1999 | Wu | ............ 438/199 |
| 5,895,959 A * | 4/1999 | Chang | |
| 5,917,218 A | 6/1999 | Choi et al. | ............ 257/345 |
| 5,920,774 A | 7/1999 | Wu | ............ 438/224 |
| 5,994,176 A | 11/1999 | Wu | ............ 438/200 |
| 6,121,077 A * | 9/2000 | Hu et al. | |
| 6,323,523 B1 * | 11/2001 | Lee et al. | |
| 6,351,364 B1 | 2/2002 | Chen et al. | ............ 361/111 |

* cited by examiner

Primary Examiner—Fetsum Abraham
(74) Attorney, Agent, or Firm—Marshall, Gerstein & Borun

(57) ABSTRACT

An electrostatic discharge (ESD) protection circuit for protecting an internal device from an ESD is disclosed. The ESD protection circuit includes an NMOS transistor connected to a ground voltage terminal having silicide layers on a gate electrode and on source/drain regions thereof; and a PMOS transistor having a gate electrode connected to a ground voltage terminal and connecting the NMOS transistor to a pad.

13 Claims, 5 Drawing Sheets

INTEGRATED CIRCUIT WITH SILICIDED ESD PROTECTION TRANSISTORS

FIELD OF THE INVENTION

The present invention relates to a semiconductor integrated circuit; and, more particularly, to an electro static discharge (ESD) protection circuit for protecting an internal device from an ESD.

DESCRIPTION OF THE PRIOR ART

In a semiconductor integrated circuit, as integration is increased, a source-to-drain channel length is decreased, thereby causing unintentional electric phenomena, such as an ESD characteristic deterioration, a hot carrier effect and a punch-through, etc. to occur.

An electrostatic discharge caused by static electricity largely includes two kinds. First is a machine model in which static electricity is caused by unstable connection of a device when the device is equipped with a test device with a package form. In this case, the static electricity has a low voltage of about 250 V, but has small impedance so the amount of electric charge is relatively high. Second is a human body model in which static electricity induced within a human body is discharged when a user touches a device. In this case, the static electricity is discharged at a high voltage of about 2000 V, but has high impedance, so the amount of electric charge is low.

When a MOS device is exposed to a static electricity discharge, a gate oxide rupture and a junction spiking, etc, can be generated so that the device can be entirely demolished or have minute damage with serious effects on its reliability.

In view of the above, an ESD protection circuit is inserted in a coupling region between internal and external circuits of an integrated device to protect it from damage caused by an influx of static electricity. The static electricity is removed by the ESD protection circuit through a ground line and a power line, thereby keeping the internal circuit safe.

The ESD protection circuit is provided with a MOS transistor between a ground and a pad to extract the static electricity toward the ground. A drain region (the pad connection part) of the MOS transistor should have high resistance to achieve enhancement of the ESD characteristic for the following reasons.

First, when the MOS transistors are turned on in the ESD situation, all of the transistors can be equally turned on without turning on specific MOS transistors at both ends of the protection circuit if each drain has an equal resistance.

Second, in the ESD situation, when the MOS transistor enters a snap-back mode, impedance of the drain must be increased in order to make the second breakdown voltage higher than the snap-back voltage, and, by doing so, various transistors can be turned on at the same time.

On the other hand, for a ULSI/VLSI MOS device requiring a high speed operation, a salicide (self-aligned silicide) process is well known as an effective method to obtain a low contact resistance and then this process is practically used.

However, the salicide process deteriorates the ESD characteristics by decreasing the drain resistance of an NMOS transistor in the ESD protection circuit. Also, the thicker the silicide layer is, the weaker the ESD protection is.

In a conventional method, even if the salicide process is applied to the integrated circuit for high speed processing, this process is not applied to a MOS transistor in an ESD protection region. This conventional method is illustrated in U.S. Pat. No. 5,994,176, assigned to Texas Instruments and Acer Incorporated, and issued on Nov. 30, 1999.

FIG. 1 is a cross-sectional view showing the aforementioned conventional method. As shown in FIG. 1, in a transistor 110 in a functional region, silicide layers 113 are formed on a gate electrode 111 and a source/drain region 112. However, in a transistor 150 in an ESD protection region, a silicide layer is not formed on a gate electrode 151 and a source/drain region 152 which are covered with a barrier layer 170.

Likewise, in the conventional method, the functional region and the ESD protection region are divided. The functional region has the salicide layer to obtain characteristic enhancement, such as a high speed operation, etc., and the ESD protection region realizes a ballast resistance which does not apply salicide layers to the MOS transistor for making the ESD protection characteristics better.

However, the conventional method requires an additional process, such as a barrier layer formation, etc., to realize the ESD protection circuit. In this case, a leakage current is generated by such an additional process, and the process is complicated and the unit cost is increased.

A design of a transistor is important to show good characteristics in an ESD protection circuit. It is especially important to prevent the formation of the silicide in the region of the NMOS transistor, passing through a current toward a ground at an ESD situation, during the formation of a semiconductor substrate.

In the fully silicide process that applies the silicide process to a source region, a drain region and a gate electrode of the ESD protection transistor, source/drain regions of the NMOS transistors in a functional region form a little resistance to thereby increase operation speed of a device. However, in such an ESD protection circuit, when an ESD situation is generated, a little resistance of drain regions brings out worse results. Therefore, for good ESD characteristics, a high resistance value of the drain region of the ESD protection transistor is required.

Since the conventional method uses a mask to prevent formation of a silicide in a drain region, the processing steps are complicated and unit price is increased. Also, as a result of the additional process, a leakage current is generated.

SUMMARY OF THE INVENTION

In accordance with an aspect of the present invention, an ESD protection circuit is provided comprising an NMOS transistor connected to a ground voltage terminal, the NMOS transistor having a gate electrode, a source region and a drain region, and further including silicide layers on the gate electrode, the source region and the drain region; and a PMOS transistor having a gate electrode connected to a ground voltage terminal, the PMOS transistor connecting the NMOS transistor to a pad.

In accordance with another aspect of the present invention, there is provided an ESD protection circuit comprising a P-type semiconductor substrate; an N-well formed in the P-type semiconductor substrate; an NMOS transistor having an N+ source junction, an N+ drain junction and a gate polysilicon which is in contact with a ground voltage line, wherein the N+ source junction, the N+ drain junction and the gate polysilicon are formed on the P-type semiconductor substrate; a PMOS transistor having a P+ drain junction, a P+ source junction and a gate polysilicon, the PMOS transistor being connected to the N+ source junction of the NMOS transistor, wherein the P+ drain junction, the P+ source junction and the gate polysilicon of the PMOS transistor are formed in the N-well; an N+ junction connected to the P+ source junction of the PMOS transistor and to a pad; and silicide layers formed on each of the gate polysilicon layers, the source and drain junctions of the PMOS and the NMOS transistors, and the N+ junction.

In accordance with yet another aspect of the present invention, there is provided a semiconductor integrated circuit, comprising a pad; an internal circuit for performing a function in response to a signal inputted to the pad and including a plurality of first MOS transistors having silicide layers on gate electrodes and on source and drain junctions; a peripheral circuit having a plurality of second MOS transistors having silicide layers on gate electrodes and on source and drain junctions thereof; and an ESD protection circuit forming a current path between the pad and the internal circuit for protecting the internal circuit from static electricity, wherein the ESD includes: an NMOS transistor connected to a ground voltage line; and a PMOS transistor having a gate electrode connected to the ground voltage line, and connecting the NMOS transistor to the pad.

DETAILED DESCRIPTION OF THE PREFERRED EMBODIMENTS

Hereinafter, ESD protection transistors will be described in detail referring to the accompanying drawings.

Figure 1:
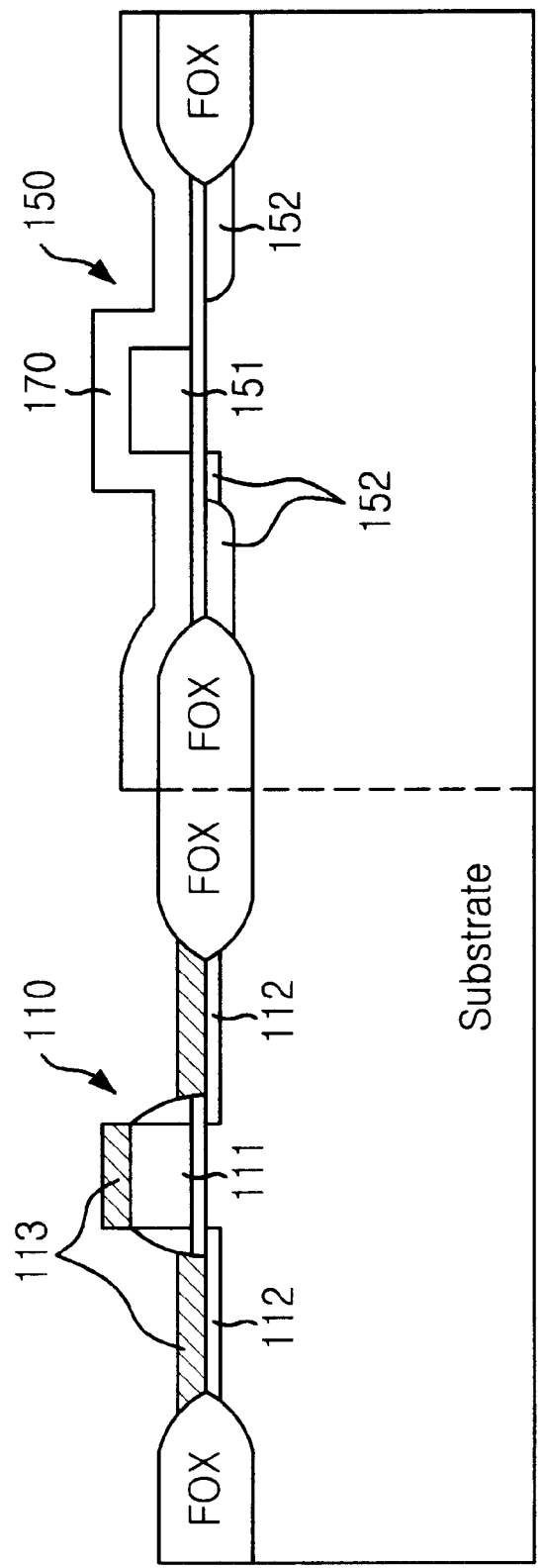
FIG. 1 is a cross-sectional view illustrating a conventional method in which a silicide layer is applied to a functional region and not to an ESD protective region.
Figure 2:
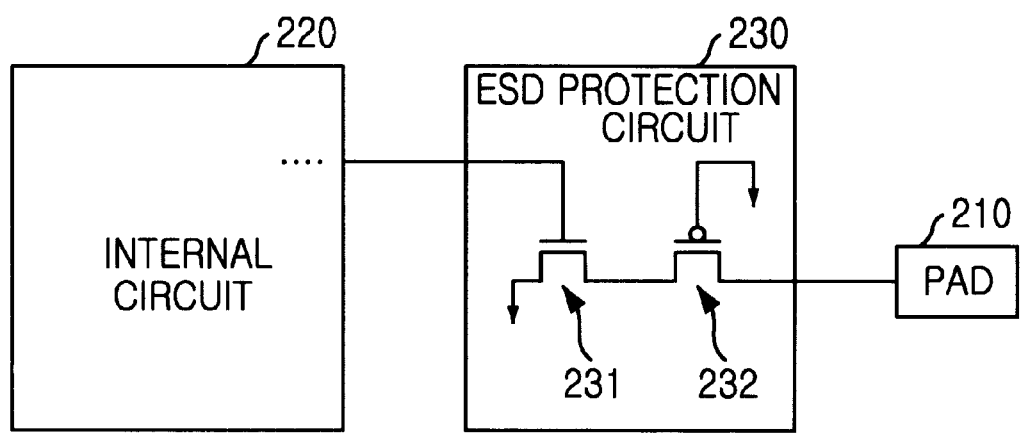
FIG. 2 is a schematic block diagram showing an exemplary configuration of an integrated circuit constructed in accordance with the teachings of the invention.

FIG. 2 is a schematic block diagram showing a configuration of an exemplary integrated circuit constructed in accordance with the teachings of the invention.

Referring to FIG. 2, an ESD protection circuit 230 is provided between a pad 210 and an internal circuit 220. Circuit 220 is a normal operating circuit portion. Different from the conventional method, a PMOS transistor 232, which plays a role of a resistor in an ESD situation, is added between a drain edge and the pad 210 of an NMOS transistor 231. Also, a silicide process is applied to the ESD protection transistors 231 and 232 and to the transistors of the internal circuit 220.

If a resistance of a drain region of the NMOS transistor 231 is decreased by the salicide process, the PMOS transistor 232 compensates for the decreased resistance. In other words, as described in the conventional method, static electricity or an error signal input to a pad is bypassed through the NMOS transistor 231 to a ground voltage line. If a drain resistance of the NMOS transistor 231 is decreased by a silicide layer, an ESD characteristic is deteriorated. So, instead of preventing application of the salicide process to the drain of the NMOS transistor 231, in the disclosed device, the PMOS transistor 232 is connected to the drain to carry out a high speed operation, reduce the complexity of the manufacturing processes, and prohibit the ESD characteristic deterioration.

In the PMOS transistor 232, a gate is connected to a ground voltage line, therefore the PMOS transistor is turned on in a normal operation, but in an ESD situation, the PMOS transistor 232 is turned off. Accordingly, a drain resistance of the NMOS transistor 231 is increased through a well of the PMOS transistor 232.

Figure 3A:
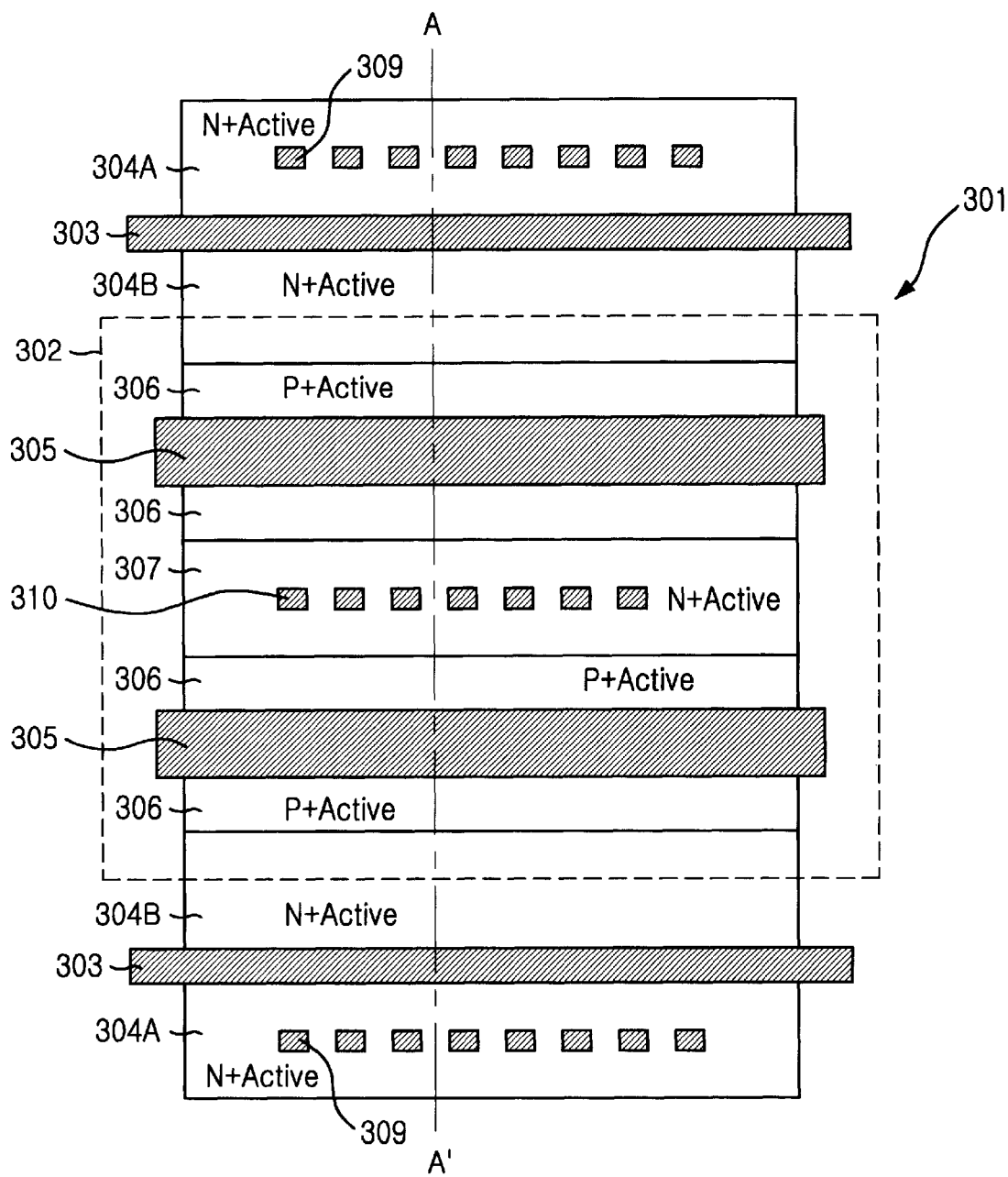
FIG. 3A is a plan view showing the ESD protection circuit of FIG. 2 in more detail.
Figure 3B:
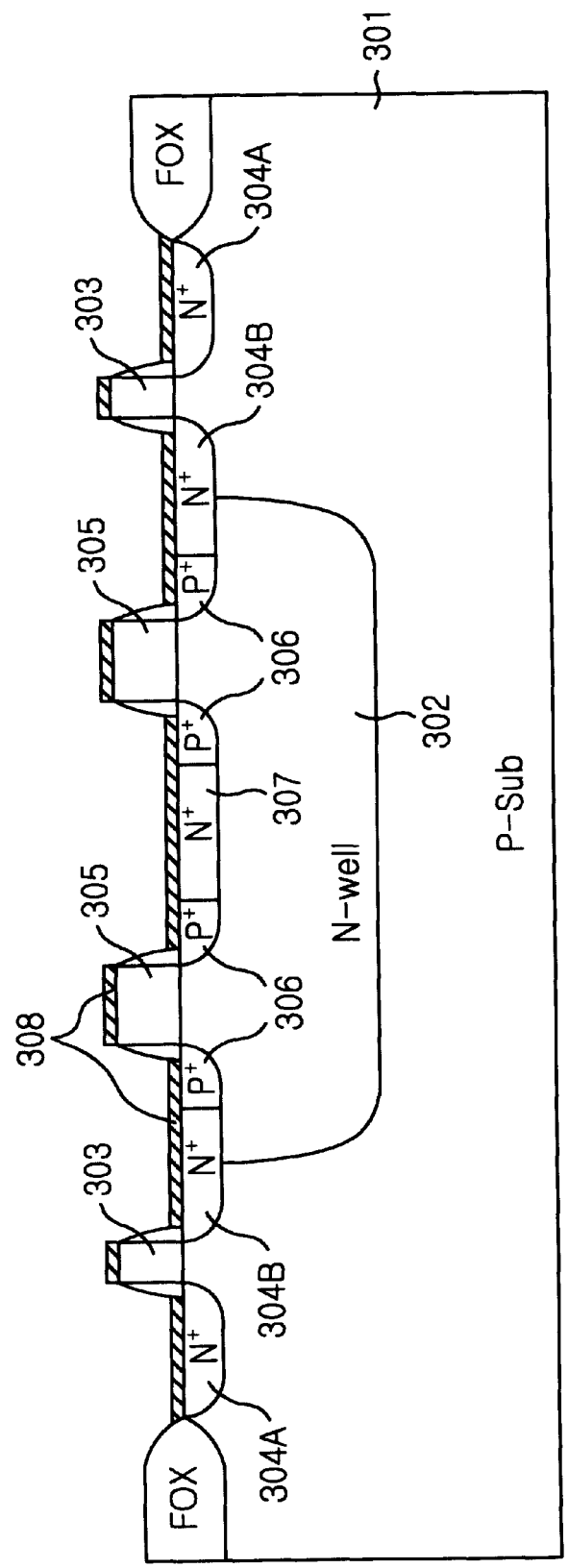
FIG. 3B is a cross-sectional view showing the ESD protection circuit of FIG. 3A.

FIG. 3A is a plan view showing the ESD protection circuit of FIG. 2 in more detail, and FIG. 3B is a cross-sectional view taken along the line A-A' of FIG. 3A. Referring to FIGS. 3A and 3B, there are shown two NMOS transistors (231 in FIG. 2), two PMOS transistors (232 in FIG. 2) and a contact region.

Referring to FIGS. 3A and 3B, an N-well 302 is formed within a portion of a P-type substrate (or well) 301, and a gate electrode 303 of an NMOS transistor and an N+ source junction 304A and an N+ drain junction 304B are formed within the P-type substrate 301.

A gate electrode 305 of a PMOS transistor, a P+ source/drain junction 306 and N+ junctions 307 for contact pad conduction lines are formed on the substrate of the N-well 302. Ground conduction line contact nodes 309 are formed on the N+ source junction 304A of the NMOS transistor.

The N+ source junction 304A and the N+ drain junction 304B of the NMOS transistor are formed. The N+ drain junction 304B is in contact with the P+ source (or drain) junction 306 of the PMOS transistor, and the P+ drain (or source) junction 306 of the PMOS transistor is formed, being in contact with the N+ junction 307.

A silicide layer 308 (in FIG. 3B) is formed on each of the gate electrodes and source/drain junctions of the PMOS and the NMOS transistors and the N+ junction 307.

The above-mentioned device manufacturing method may be introduced to normal semiconductor integrated circuit manufacturing technologies. A barrier layer is not used in the ESD protection circuit region, and a normal salicide process is applied to the source/drain regions.

A silicide layer is a transition metal, such as Ti, Co, W, Ni, Pt, etc., which undergoes a rapid thermal processing (RTP) to react an active region (silicon substrate) and a silicon of a gate polysilicon with the transition metal, thereby forming metal silicide layers such as TiSi, CoSi, WSi, NiSi, PtSi, etc. The RTP is carried out at a temperature of 350° C. to 750° C. and, after removing an unreacted transition metal, only the silicide layer remains on the gate and the active region.

Figure 4A:
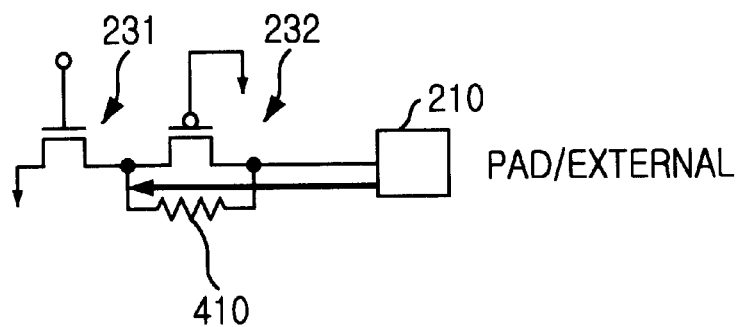
FIG. 4A is a circuit diagram showing an equivalent circuit and a current path in a normal operation of the ESD protection circuit.
Figure 4B:
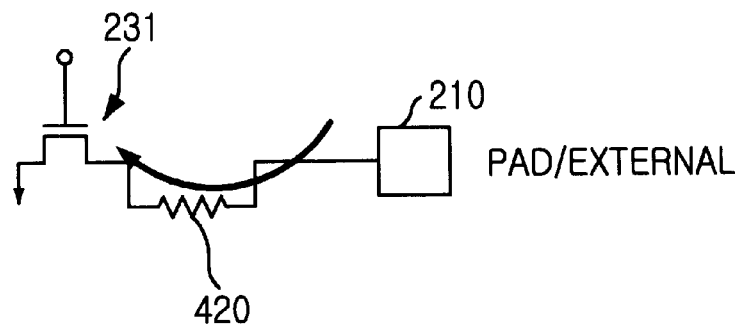
FIG. 4B is a circuit diagram showing an equivalent circuit and a current path in an ESD situation of the ESD protection circuit.

FIG. 4A is a circuit diagram showing an equivalent circuit and a current path in an normal operation of an ESD protection circuit. FIG. 4B is a circuit diagram showing an equivalent circuit and a current path in an ESD situation of an ESD protection circuit. In FIG. 4A, the gate electrode of the PMOS transistor 232 is connected to the ground voltage line and turned on so that a low resistance path 410 is formed. In FIG. 4B, the PMOS transistor is in the turned off state and, thus, it forms a large resistance path 420 through the N-well (302 of FIG. 3).

The disclosed devices make it possible to apply a salicide process to the whole region of an integrated circuit including an ESD protection circuit and have good ESD protection characteristics. The disclosed devices decrease processing time and cost by eliminating a silicide protection or a silicide blocking which is needed in the prior art ESD protection circuit manufactured via conventional salicide processing. Also, the disclosed devices can prevent characteristic deterioration and also can obtain good circuit and structure for an ESD protection circuit, by inserting a PMOS transistor into a drain region of an NMOS transistor for an ESD protection transistor with low resistance.

The disclosed device applies a silicide process to a source region, a drain region and a gate electrode of a MOS transistor, and inserts a PMOS transistor into a drain region of an NMOS transistor for an ESD protection transistor. That is, in the disclosed device, the drain region of the NMOS transistor is connected to a pad through an N-well and the PMOS transistor is formed in the N-well.

In the ESD protection circuit of the disclosed device, a ground voltage level is applied to the gate of the PMOS transistor, so the PMOS transistor is turned on in a normal operation, thereby forming a small resistance through the PMOS transistor. In an ESD situation, the PMOS transistor is turned off, so a path is formed through the N-well of the bottom portion of the PMOS transistor, which forms a large resistance. Therefore, in the ESD situation, current inputted from outside passes through the N-well, so an essentially required resistance is obtained by the N-well.

An ESD protection circuit and an integrated circuit, which have good ESD characteristics, and which simplifies the manufacturing process are disclosed.

What is claimed is:

1. An ESD protection circuit, comprising:
   an NMOS transistor having a gate electrode, a source region, and a drain region, and further including silicide layers on the gate electrode, the source region and the drain region; and
   a PMOS transistor having a gate electrode connected to a ground voltage terminal, the PMOS transistor connecting the NMOS transistor to a pad to receive input signals, wherein a first terminal of the PMOS transistor is connected to the pad, a second terminal of the PMOS transistor is connected to a first one of the source region and the drain region of the NMOS transistor, and a second one of the source region and the drain region of the NMOS transistor is connected to the ground voltage terminal.

2. An ESD protection circuit as recited in claim 1, wherein the PMOS transistor is formed in an N-well of a semiconductor substrate and wherein the PMOS transistor includes:
   source and drain junctions formed in the N-well of the semiconductor substrate;
   a gate polysilicon formed on the N-well of the semiconductor substrate; and
   silicide layers formed on the gate polysilicon and the source and drain junctions.

3. An ESD protection circuit as recited in claim 1, wherein the silicide layer is any one selected from the group consisting of TiSi, CoSi, WSi, NiSi and PtSi.

4. An ESD protection circuit, comprising:
   a P-type semiconductor substrate;
   an N-well formed in the P-type semiconductor substrate;
   an NMOS transistor having an N+ drain junction, an N+ source junction and a gate polysilicon which is in contact with a ground voltage line, wherein the N+ source junction, the N+ drain junction and the gate polysilicon are formed on the P-type semiconductor substrate;
   a PMOS transistor having a P+ drain junction, a P+ source junction and a gate polysilicon, the P+ drain junction of the PMOS transistor being connected to the N+ drain junction of the NMOS transistor, wherein the P+ drain junction and the P+ source junction are formed in the N-well, and the gate polysilicon of the PMOS transistor is formed on the N-well;
   an N+ junction connected to the P+ source junction of the PMOS transistor and to an input pad for inputting signals via the ESD protection circuit; and
   silicide layers formed on each of the gate polysilicon layers, the source and drain junctions of the PMOS and the NMOS transistors and the N+ junction.

5. An ESD protection circuit as recited in claim 4, wherein the N+ junction is formed within the N-well region.

6. An ESD protection circuit as recited in claim 4, wherein the silicide layer is any one selected from the group consisting of TiSi, CoSi, WSi, NiSi and PtSi.

7. A semiconductor integrated circuit, comprising:
   a pad to receive a signal input to the integrated circuit;
   an internal circuit for performing a function in response to a signal inputted to the pad and including a plurality of MOS transistors having silicide layers on gate electrodes and source and drain junctions thereof; and
   an ESD protection circuit forming a current path between the pad and the internal circuit for protecting the internal circuit from static electricity, wherein the ESD protection circuit includes:
      an NMOS transistor connected to a ground voltage line; and
      a PMOS transistor having a gate electrode connected to the ground voltage line, a first terminal connected to the pad, and a second terminal connected to a first terminal of the NMOS transistor, wherein a second terminal of the NMOS transistor is connected to the ground voltage terminal.

8. A semiconductor integrated circuit as recited in claim 7, wherein the PMOS transistor is formed in an N-well of a semiconductor substrate and wherein the PMOS transistor includes:
   source and drain junctions formed in the N-well of the semiconductor substrate;
   a gate polysilicon formed on the N-well of the semiconductor substrate; and
   silicide layers formed on the polysilicon gate and on the source and drain junctions.

9. A semiconductor integrated circuit as recited in claim 7, wherein the silicide layer is any one selected from the group consisting of TiSi, CoSi, WSi, NiSi and PtSi.

10. An ESD protection circuit for an integrated circuit, comprising:
   at least one current path transistor formed between an internal circuit and an input pad for receiving an input signal for the internal circuit;
   a PMOS transistor coupling the current path transistor to the pad for increasing input resistance of the current path transistor; and, at least one silicide layer disposed on the at least one current path transistor and the internal circuit.

11. An ESD protection circuit as recited in claim 10, wherein the PMOS transistor is formed in an N-well of a semiconductor substrate and the N-well functions as a resistance component when static electricity is input into the internal circuit through the pad.

12. An ESD protection circuit as recited in claim 11, wherein the current path transistor is an NMOS transistor, and the at least one silicide layer is disposed on a gate electrode and on source and drain regions of the NMOS transistor.

13. An ESD protection circuit as recited in claim 12, wherein the at least one silicide layer is disposed on a gate electrode and on source and drain regions of the PMOS transistor.

* * * * *